United States Patent [19]
Hsu

[11] Patent Number: 5,633,530
[45] Date of Patent: May 27, 1997

[54] MULTICHIP MODULE HAVING A MULTI-LEVEL CONFIGURATION

[75] Inventor: Chen-Chung Hsu, Taichung, Taiwan

[73] Assignee: United Microelectronics Corporation, Hsinchu, Taiwan

[21] Appl. No.: 547,555

[22] Filed: Oct. 24, 1995

[51] Int. Cl.$^6$ .................................................. H01L 23/02
[52] U.S. Cl. ........................ 257/685; 257/686; 257/698
[58] Field of Search .................................. 257/685, 686, 257/692, 693, 697, 666, 698

[56] References Cited

U.S. PATENT DOCUMENTS

| | | | |
|---|---|---|---|
| 5,043,794 | 8/1991 | Tai et al. | 257/686 |
| 5,376,825 | 12/1994 | Tukamoto et al. | 257/686 |
| 5,498,902 | 3/1996 | Hara | 257/686 |

FOREIGN PATENT DOCUMENTS

| | | | |
|---|---|---|---|
| 59-136963 | 8/1984 | Japan | 257/686 |
| 2-39445 | 2/1990 | Japan | 257/685 |

*Primary Examiner*—Mahshid D. Saadat
*Assistant Examiner*—S. V. Clark
*Attorney, Agent, or Firm*—Cushman Darby & Cushman, IP Group of Pillsbury Madison & Sutro, LLP

[57] ABSTRACT

A multichip module (MCM) configuration and a method of packaging semiconductor integrated circuit chips in a multilevel arrangement are described. Essentially, a novel module template is provided for packaging multi-level semiconductor chips. The module template includes at least two chambers which communicate with each other and are arranged vertically, and a plurality of parallel pins extending outward. Each chamber contains a round-shaped stage formed on the bottom of the chamber, a plurality of leadframes formed over the stage and connected to the desired pins, and a support member formed around the upper end of the chamber. The semiconductor chips to be packaged are prepared with predetermined circuits and conductive pads. One of the semiconductor chips is first adhered to the stage of the lowest exposed chamber. The conductive pads are connected to the corresponding leadframes by metal wires. Then, a covering plate is sealed on the support member of the lowest exposed chamber. The same procedure is carried out for each chamber from the lower most to the uppermost until all of the semiconductor chips are packaged.

12 Claims, 3 Drawing Sheets

MULTICHIP MODULE HAVING A MULTI-LEVEL CONFIGURATION

BACKGROUND OF THE INVENTION

1. Field of the Invention

The present invention relates in general to the packaging of semiconductor integrated circuit chips. More specifically, the invention relates to multilevel packaging of high density semiconductor devices. In particular, the present invention provides a multichip module (MCM) having a multi-level configuration and a method for packaging semiconductor integrated circuit chips in a multilevel arrangement.

2. Description of Related Art

The ever-increasing complexity of computer systems makes it necessary to provide more integrated circuit chips within a given available circuit board surface area.

Of course, semiconductor manufacturers have been providing higher and higher integration density of the chips themselves by reducing the dimensions of components integrated into a chip. However, as sub-micron dimensions are approached, there arise practical limits to integration density.

Another approach for increasing the number of components per unit of surface area is to increase the elementary surface area of the semiconductor integrated circuit chips. However, increasing the size of the chips is a problem in that there is only a limited space available in computer systems in which to place them. This approach also presents manufacturing problems.

Yet another approach has been proposed. This approach is to utilize a so-called "multichip module" (MCM), each of which can package two or more semiconductor integrated circuit chips in stacked fashion. Using multichip modules is advantageous because they immediately increase the density that can be obtained. However, known multichip modules are difficult to utilize and have poor heat dissipation.

SUMMARY OF THE INVENTION

It is therefore an object of the present invention to provide a multichip module and a relatively easy method for packaging semiconductor integrated circuit chips in a multilevel (stacked) arrangement.

Another object of the invention is to provide an arrangement for a multichip module that has better heat dissipation than that of known multichip modules.

The present invention meets these objectives by providing a novel arrangement for a multichip module and a method of packaging semiconductor integrated circuit chips in a multilevel arrangement. The arrangement provided by the present invention is such that there is a separation between stacked chips which allows for better heat dissipation.

The present invention provides a method of packaging semiconductor integrated circuit chips in a multilevel arrangement. The method includes the following steps:

(a) providing a module template having at least two chambers which communicate with each other and are arranged vertically, and having a plurality of parallel pins extending outward, each of the chambers containing a substantially round-shaped stage formed on the bottom of the chamber, a plurality of leadframes formed over the stage and connected to desired ones of the pins, and a support member formed around the upper end of the chamber;

(b) providing at least two semiconductor integrated circuit chips each having conductive pads;

(c) adhering one of the semiconductor integrated circuit chips to the stage of the lowest exposed chamber and connecting the conductive pads to corresponding leadframes by metal wires;

(d) sealing a covering plate on the support member of the lowest exposed chamber; and (e) repeating steps (c) to (d) for each successive chamber until each of the semiconductor integrated circuit chips is fitted with one of the chambers.

The invention also provides an arrangement for a semiconductor multichip module which comprises:

a module template having at least two chambers which communicate with each other and are arranged vertically;

a plurality of parallel pins extending outwardly from the module;

a substantially round stage formed on the bottom of each chamber, each stage being adapted to receive a semiconductor integrated circuit chip having conductive pads;

leadframes formed over each stage and connected to desired pins;

a support member formed around the upper end of the chamber;

metal wires for connecting the conductive pads with the leadframes; and a covering plate sealed on the support members of each chamber.

BRIEF DESCRIPTION OF THE DRAWINGS

Other objects, features, and advantages of the present invention will become apparent by way of the following detailed description of the preferred but non-limiting embodiment. The description is made with reference to the accompanying drawings in which.

DETAILED DESCRIPTION OF THE PREFERRED EMBODIMENT

Figure 1:
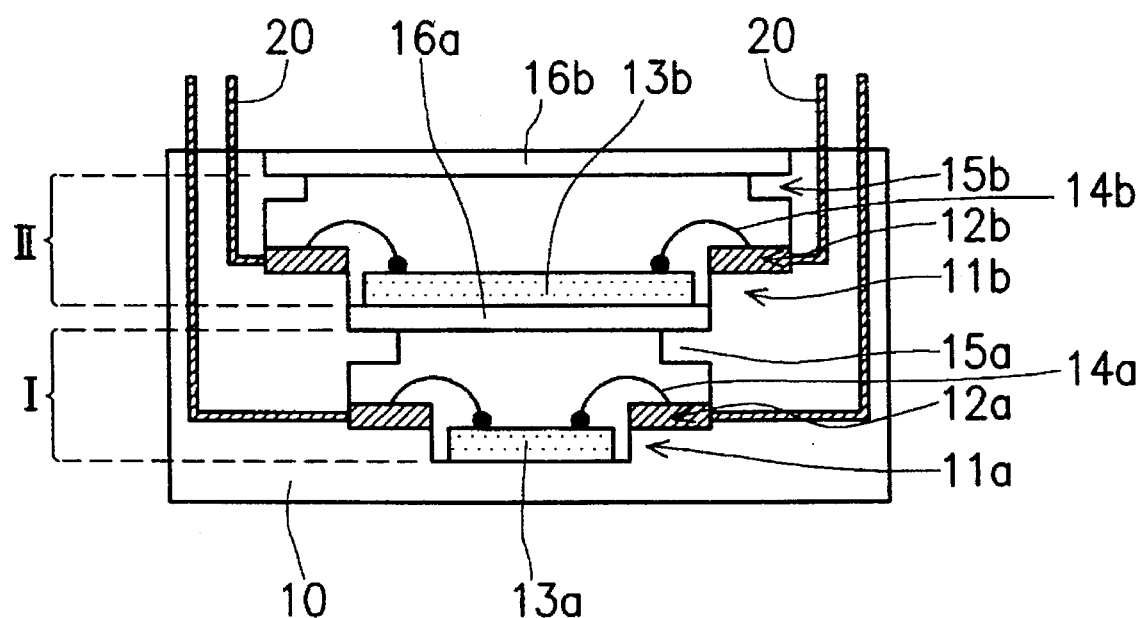
FIG. 1 shows a cross-sectional view of a preferred embodiment of a multichip module device in accordance with the present invention.

FIG. 1 is a cross-sectional view of a preferred embodiment of a multichip module in accordance with the present invention FIGS. 2A–2D are top views of the multichip module shown in various steps of fabrication.

For simplicity, the device depicted has only two levels. However, in practice, the devices according to the present invention can have more than two levels. Furthermore, although a pin grid array (PGA) type of package is described, it is not intended that the invention be limited thereto. Other kinds of packaging come within the spirit of the present invention.

Figure 2A:
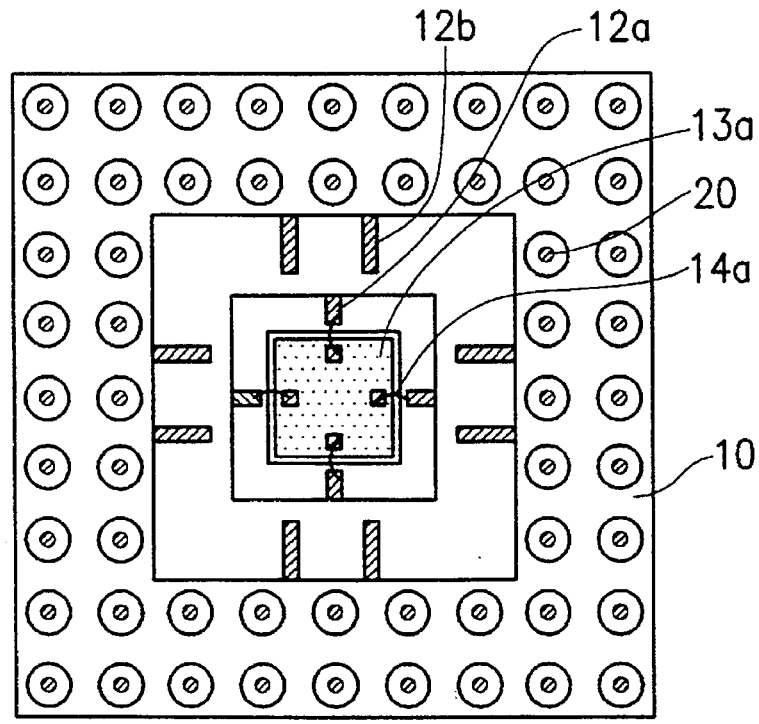
FIGS. 2A to 2D are top views showing the various steps of packaging semiconductor integrated circuit chips in accordance with the principles of the present invention.

Referring now to FIGS. 1 and 2A, there is schematically shown a module template 10 which includes two chambers, chambers I and II, and a plurality of parallel pins 20 extending vertically outward from the device. These two chambers I and II are arranged in a vertical manner and communicate with each other. A round-shaped stage 11a is formed at the bottom of chamber I. A plurality of leadframes 12a are formed over stage 11a with connections to desired ones of pins 20. A support member 15a is formed around the upper end of the chamber I. Similarly, another round-shaped stage 11b, leadframes 12b, and support member 15b are formed on the corresponding locations of chamber II. These chambers I and II can be made of, for example, a ceramic material or a plastic material.

Figure 2B:
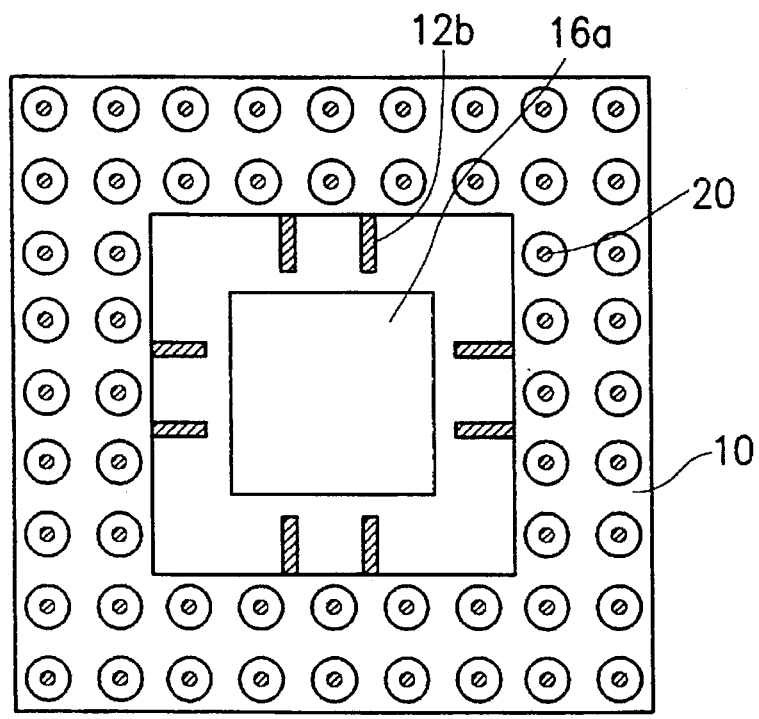

As is shown in FIG. 2A, a first semiconductor chip 13a including predetermined circuits and conductive pads (the small black dies formed in the peripheral area of the semiconductor chip) is adhered to stage 11a of chamber I by using, for example, a silver glue or an aluminum-silicon fusion method. Metal wires 14a, for example, gold or aluminum wires, are then formed to connect the conductive pads of the chip 13a to the corresponding leadframes 12a. After that, as can be seen in FIG. 1 and FIG. 2B, a covering plate 16a is sealed on the support member 15b of the chamber I.

Figure 2C:
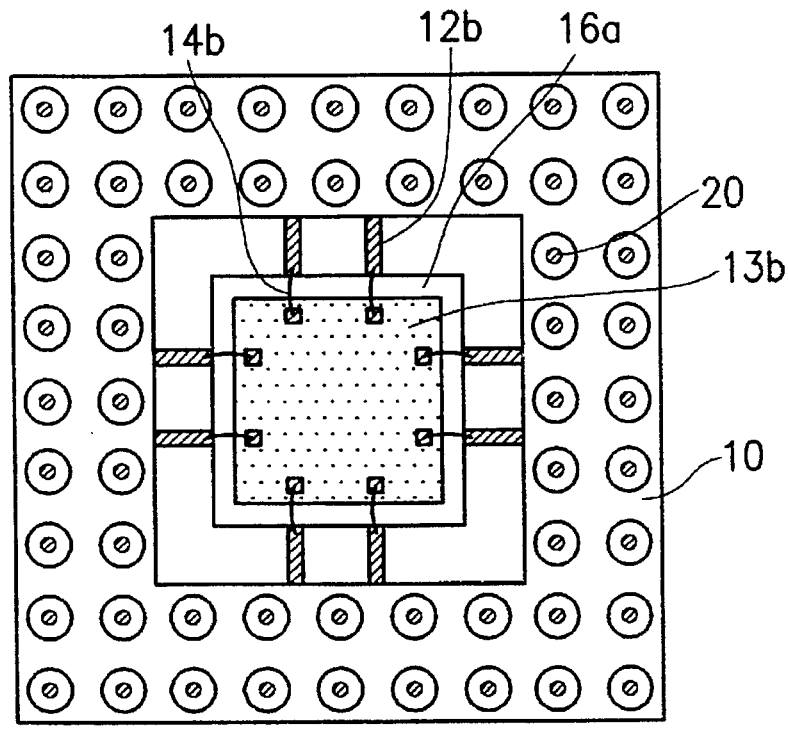
Figure 2D:
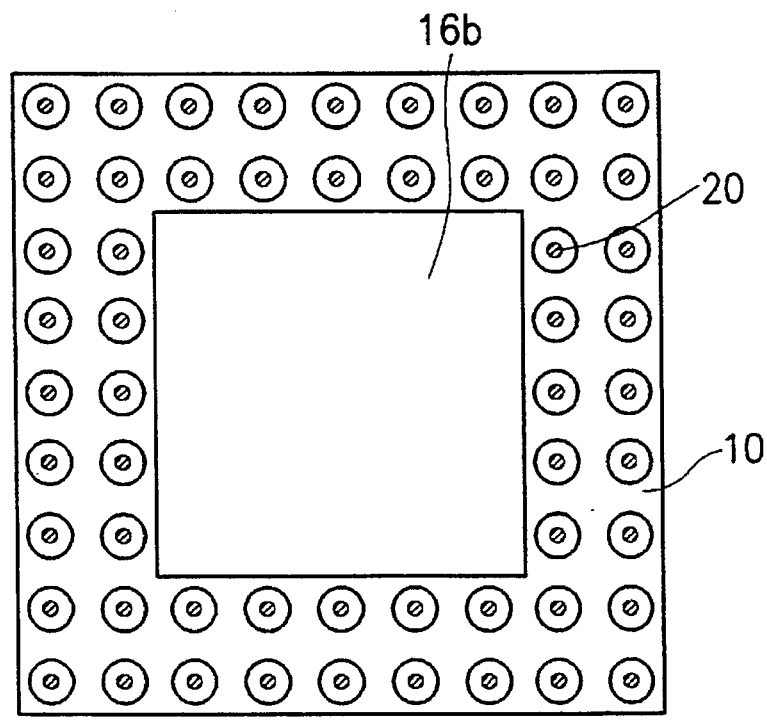

Referring to FIG. 1 and FIG. 2C, in a manner similar to the one described above, a second semiconductor chip 13b is installed in chamber II. Semiconductor chip 13b having predetermined circuits and conductive pads is adhered to stage 11b of chamber II by using, for example, a silver glue or an aluminum-silicon fusion method. Next, metal wires 14b, for example, gold or aluminum wires, are then used to connect the conductive pads of the chip 13b to the corresponding leadframes 12b. After that, as can be seen in FIG. 1 and FIG. 2D, a covering plate 16b is sealed on the support member 15b of the chamber II. This completes the package of an MCM device with two levels of semiconductor chips. Since the first and second semiconductor chips 13a and 13b are separated from each other with gaps therebetween, the problem of poor heat dissipation that arises with the conventional MCM technique is overcome. Thus, a MCM device with better electric properties is obtained.

To package an MCM device having more than two semiconductor chips, the above described sequence of adhering, connecting, and sealing steps is repeated from the bottom chamber to the uppermost chamber, until all of the semiconductor chips are packaged in the module template.

While the described embodiment represents the preferred form of the present invention, it is to be understood that modifications will occur to those skilled in the art without departing from the spirit of the invention. The scope of the invention is therefore to be determined solely by the following claims.

What is claimed is:

1. A semiconductor multichip module configuration, comprising:

a module template having an interior portion and at least two chambers which communicate with each other and are arranged vertically in said interior portion;

a plurality of parallel pins extending outwardly from said module template;

a stage at the bottom of each chamber;

a plurality of leadframes formed over each stage and connected to predetermined ones of said parallel pins;

a support member formed around the upper end of each chamber;

at least two semiconductor chips having predetermined circuits and conductive pads, each chip being adhered to a respective one of said stages;

metal wires connecting said conductive pads of each chip with corresponding ones of said leadframes; and a covering plate for each chamber sealed on its respective support member.

2. A semiconductor multichip module configuration according to claim 1, wherein the chambers are made of a ceramic material.

3. A semiconductor multichip module configuration according to claim 1, wherein the chambers are made of a plastic material.

4. A semiconductor multichip module configuration according to claim 1, wherein the metal wires are made of gold.

5. A semiconductor multichip module configuration according to claim 1, wherein the metal wires are made of aluminum.

6. A semiconductor multichip module configuration according to claim 1, wherein the covering plates are made of a metal material.

7. A semiconductor multichip module configuration according to claim 1, wherein said stages are substantially round.

8. A semiconductor multichip module configuration according to claim 1, wherein said chambers communicate with each other and are arranged such that heat from said chips is allowed to flow between said stages.

9. A semiconductor multichip module configuration according to claim 6, wherein said metal material is thermally conductive.

10. A semiconductor multichip module comprising:

a module template having an interior portion and a housing surrounding said interior portion;

at least two stages disposed in said interior portion of said module template, said stages being stacked vertically with respect to each other and separated by a predetermined gap such that heat from successive stages is allowed to disspitate through said interior portion, each said stage including:

a semiconductor chip having conductive pads adhered to the bottom of said stage, leadframes correspondingly connected to said conductive pads by metal wires and extending into said housing, and supporting means for supporting a covering plate disposed above the bottom of said stage by said predetermined gap, said covering plate of said stage forming the bottom of a successive stage stacked vertically above said stage; and a plurality of pins extending outwardly from said housing and respectively connected to predetermined ones of said leadframes of each said stage.

11. A semiconductor multichip module as defined in claim 10, wherein said covering plate of each said stage is comprised of a thermally conductive metal material.

12. A semiconductor multichip module as defined in claim 11, wherein said housing is comprised of one of a ceramic material and a plastic material.

* * * * *